(12) United States Patent
Veeramma

(10) Patent No.: US 8,153,481 B2
(45) Date of Patent: Apr. 10, 2012

(54) SEMICONDUCTOR POWER DEVICE WITH PASSIVATION LAYERS

(75) Inventor: Subhas Chandra Bose Jayappa Veeramma, Lampertheim (DE)

(73) Assignee: IXYS Corporation, Milpitas, CA (US)

( * ) Notice: Subject to any disclaimer, the term of this patent is extended or adjusted under 35 U.S.C. 154(b) by 573 days.

(21) Appl. No.: 11/380,466

(22) Filed: Apr. 27, 2006

(65) Prior Publication Data

US 2006/0246642 A1 Nov. 2, 2006

Related U.S. Application Data

(60) Provisional application No. 60/676,079, filed on Apr. 28, 2005.

(51) Int. Cl.
*H01L 21/332* (2006.01)

(52) U.S. Cl. .. 438/140; 438/133; 438/787; 257/E29.013

(58) Field of Classification Search ................. 438/133, 438/787, 140; 257/E29.013
See application file for complete search history.

(56) References Cited

U.S. PATENT DOCUMENTS

| | | | | |
|---|---|---|---|---|
| 4,803,541 A * | 2/1989 | Kouda | ........................... | 257/786 |
| 4,892,753 A * | 1/1990 | Wang et al. | ................... | 427/579 |
| 5,219,783 A * | 6/1993 | Moslehi | ........................ | 438/420 |
| 5,462,898 A * | 10/1995 | Chen et al. | .................... | 438/788 |
| 5,629,552 A * | 5/1997 | Zommer | ........................ | 257/490 |
| 5,698,456 A * | 12/1997 | Bryant et al. | ..................... | 438/6 |
| 5,750,414 A | 5/1998 | Whitney | | |
| 5,891,762 A | 4/1999 | Sakai et al. | | |
| 6,190,948 B1 * | 2/2001 | Seok | ............................. | 438/140 |
| 2004/0119087 A1 | 6/2004 | Veeramma et al. | | |
| 2006/0214221 A1 * | 9/2006 | Challa et al. | .................. | 257/328 |

OTHER PUBLICATIONS

Subhas chandra Bose, J.V.; Ostmann, H.; and Ingram, P.; "Novel Low Leakabe Current—Stable Hiper FREDs"; Jun. 2006; Bodos Power Systems magazine; pp. 24-26.*
European Patent Office, European Search Report for European Patent Application No. EP06008480, 5 pages (Search completed Feb. 29, 2008).

* cited by examiner

*Primary Examiner* — Stephen W Smoot
*Assistant Examiner* — Vicki B Booker
(74) *Attorney, Agent, or Firm* — Kilpatrick Townsend & Stockton LLP

(57) ABSTRACT

A semiconductor power device comprises a semiconductor substrate. The substrate includes an N-type silicon region and N+ silicon region. An oxide layer overlies the N− type silicon region, the oxide layer formed using a Plasma Enhanced Chemical Vapor deposition (PECVD) method. First and second electrodes are coupled to the N− type silicon region and the N+ type silicon region, respectively. The oxide layer has a thickness 0.5 to 3 microns. The power device also includes a polymide layer having a thickness of 3 to 20 microns; a first field plate overlying the oxide layer; and second field plate overlying the polymide layer and the first field plate, wherein the second field plate overlaps the first field plate by 2 to 15 microns.

15 Claims, 2 Drawing Sheets

SEMICONDUCTOR POWER DEVICE WITH PASSIVATION LAYERS

CROSS-REFERENCE TO RELATED APPLICATION

The present invention claims the benefit of App. No. 60/676,079, filed on Apr. 28, 2005, which is incorporated by reference.

BACKGROUND OF THE INVENTION

The present invention relates to the design and fabrication of semiconductor power devices, more particularly to robust power devices. For example, diodes that are not sensitive to High Temperature Reverse Bias (HTRB) and Humidity test conditions.

Reliability is the characteristic expressed by the probability that a given device will perform its intended function for a specific period of time under user defined conditions. The reliability of a new product is tested by having the product undergo one or more tests that are conducted under harsh conditions to obtain reliability results after a short test period. Such tests are generally conducted under "extreme" conditions to achieve an acceleration effect. High Temperature Reverse Bias (HTRB) and Humidity tests are two such tests.

HTRB test checks the ability of the samples to withstand a reverse bias while being subjected to the maximum ambient temperature that the parts are rated to withstand. Humidity test checks the ability of the package and passivation layers to resist moisture penetration. The sample is loaded into an environmental chamber. The relative humidity is then increased to 85%, and the temperature is elevated.

It is well known that in semiconductor devices early failures occur when a part with some latent defect passes screening but later deteriorates and prematurely fails in the end application. The cause of the failure might be from poor design, inconsistent process control, failure in passivation, die microcracks, junction contamination, die bonding anomalies and so forth. Furthermore devices used in high power electronic equipment are exposed to different temperature and humidity conditions.

The passivation of the surface of discrete power devices determines the ability of the device to withstand high surface electric fields. The surface charge induced by the passivation layer strongly influences the electric fields in the bulk. Generally silicon dioxide and silicon nitride sandwich or semi-insulating polycrystalline silicon or zinc borosilicate glass or oxide and metal field plate sandwich are used as a passivation layer. It has been observed that depending upon the design of passivation layers devices are sensitive to reliability testing, i.e., increase in leakage current during HTRB and Humidity test conditions. Consequently, among other needs, it would be desirable to make a robust power device that can withstand HTRB and Humidity test conditions.

SUMMARY OF THE INVENTION

The present invention relates to power devices, e.g., diode, MOSFET, and IGBT. An embodiment of the present invention provides using a PECVD oxide as a passivation layer to obtain consistent device characteristics. In one embodiment, a semiconductor power device comprises a semiconductor substrate; an oxide layer overlying the substrate, the oxide layer formed using a Plasma Enhanced Chemical Vapor deposition (PECVD) method; and first and second electrodes coupled to first and second portions of the substrate, wherein the oxide layer has a thickness 0.5 to 2 microns. The power device also includes a polymide layer having a thickness of 3 to 20 microns; a first field plate overlying the substrate; and second field plate overlying the polymide layer and the first field plate, wherein the second field plate overlaps the first field plate by 2 to 15 microns.

In another embodiment, a method of forming a power semiconductor device includes forming a first oxide layer directly on a semiconductor substrate of a first conductivity type using a Plasma Enhanced Chemical Vapor Deposition (PECVD) method. A first doped region of a second conductivity type is formed within the substrate. A second oxide layer is formed directly on the first oxide layer using a PECVD method to form a first passivation layer comprising the first and second oxide layers. A second passivation layer is formed on the first passivation layer. The power device is a discrete power device, e.g., a diode, a MOSFET, or an IGBT.

The above embodiment may be implemented in various different ways, as described below. The first passivation layer has a thickness 3 microns or less. The second passivation layer comprises polymide and has a thickness of at least 16 microns. Alternatively, the first passivation layer has a thickness 2 microns or less, or has a thickness of about 0.5 micron to about 2 microns.

The substrate has a second doped region of the first conductivity type, and the method further comprises forming a first metal electrode contacting the first doped region; and forming a second metal electrode contacting the second doped region. The first doped region is provided proximate an upper surface of the substrate and the second doped region is provided proximate a lower surface of the substrate.

The method further comprises forming first and second field plates over the first passivation layer; and forming a third passivation layer on the second passivation layer. The first field plate has a first portion that extends along a first lateral direction between the first and second passivation layers. The second field plate has a second portion that extends along a second lateral direction between the second and third passivation layers, wherein the first and second portions define a curved path to the substrate from the third passivation layer.

In yet another embodiment, a method of forming a power device includes forming a first passivation layer on a substrate of a first conductivity type; forming a first field plate on the first passivation layer, the first field plate having a first portion that extends along a first lateral direction; forming a second passivation layer on the first passivation layer; forming a second field plate on the second passivation layer, the second field plate having a second portion that extends along a second lateral direction, the first and second portion overlapping each other to define a curved path to the substrate, wherein the power device is provided with at least first and second metal electrodes to conduct electricity. The first passivation is formed directly on the substrate using a Plasma Enhanced Chemical Vapor deposition (PECVD) method.

DETAILED DESCRIPTION OF THE INVENTION

The present invention relates to power devices, e.g., a diode, MOSFET, and IGBT, that exhibit robust characteristics, particularly when exposed to HTRB and/or Humidity tests.

Figure 1:
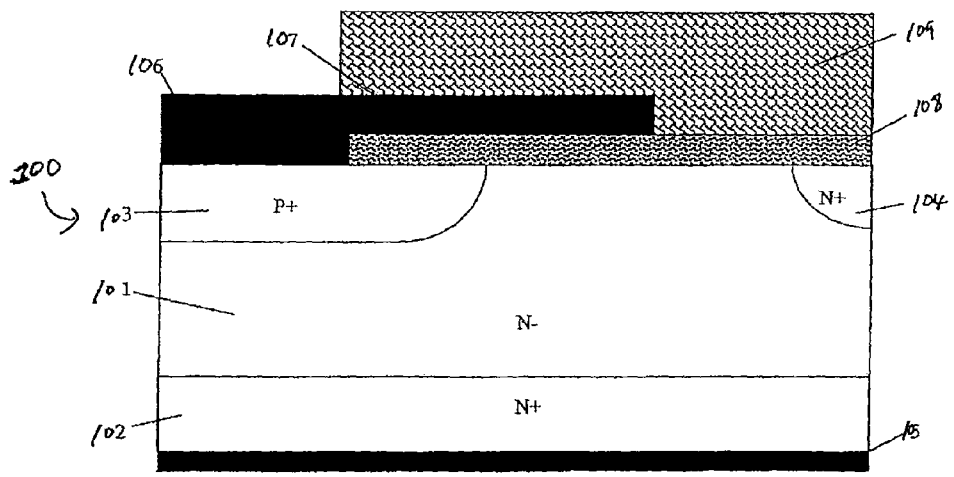
FIG. 1 illustrates a power device.

FIG. 1 illustrates a power device 100, e.g., a diode. The diode includes an N-type region 101 with N− low doping concentration. An N+ region 102 is provided on the backside (or lower side) of the region 101. The N+ region has a high doping concentration relative to the region 101. The N+ doped region 102 is a substrate in the present embodiment, but may be a diffused layer formed on a substrate in other embodiments. A cathode 105 contacts the N+ region 102. The cathode is generally made of metal. As used herein, the term "substrate" refers to a semiconductor region of sufficient thickness. Accordingly, the term substrate may be used to region 101, region 102, or regions 101 and 102 together.

A P+ doped emitter region 103 is provided on the front side (or upper side) of the region 101. An anode 106 contacts the emitter region 103. The anode is generally made of metal. An N+ region 104 (or channel stopper) is formed at the edge of the die. An oxide layer 108 is formed on the upper surface of the substrate or region 101 as a first passivation layer. In diodes that are designed for low blocking voltage, a field plate 107 is formed around the emitter region and on the oxide layer 108. The field plate may be an extension of anode metal 106, or it can be formed with a separate process. A second passivation layer 109 is formed on the oxide layer 108 and the field plate 107. The second passivation layer 109 may be either silicon nitride or polymide.

According to one fabrication method, a silicon dioxide (wet or dry) is first grown on a substrate (e.g., the region 101). A photomask layer is formed and patterned to open an N+ region (e.g., the region 104). N-type dopants are driven into the opening to form the N+ region. Another photomask layer is provided and patterned to open the P+ region (e.g., the region 103). P-type dopants are provided on the area exposed by the opening. Boron is typically used as the P-type dopants. The silicon is heated in oxygen ambient. The P-type dopants are driven into the substrate to form an emitter region. Since the substrate is heated in oxygen environment, an oxide layer (e.g., the passivation layer 108) is grown on the substrate at the same time the P-type dopants are driven into the substrate. It is believed that about 35% of silicon is consumed during the silicon dioxide growth process.

Yet another photomask layer is formed and pattern to define the contact opening for the anode (e.g., anode 106). A metal layer is formed on the contact opening to form the anode. The metal layer is patterned or opened to expose the oxide layer. A polymide layer is formed on the oxide layer as a second passivation layer (e.g., the passivation layer 109). The polymide layer is generally formed to a thickness of 10-20 microns.

The above process steps are summarized below.
1. oxidation
2. Photomask: open N+ area
3. N+ doping and drive-in
4. Photomask: open p+ area (emitter)
5. P+ doping (Boron implantation)
6. P+ drive-in and oxidation
7. Photomask for contact opening
8. Metallization
9. Photomask: Open metallization on Passivation layer
10. 10 to 20 microns polymide passivation.

A diode (e.g., the diode 100) fabricated by using the above process displays low leakage current during a static condition. For example, for a diode rated at 300V, the leakage current is 1 µA at 25 degrees centigrade, and 50 µA at 150 degrees centigrade. However during HTRB test, the leakage current spikes up to 2 mA for a short period of time (e.g., about 5 hours) and then returns to 5 µA. This inconsistent performance of the diode 100 raises questions about its robustness.

Figure 2:
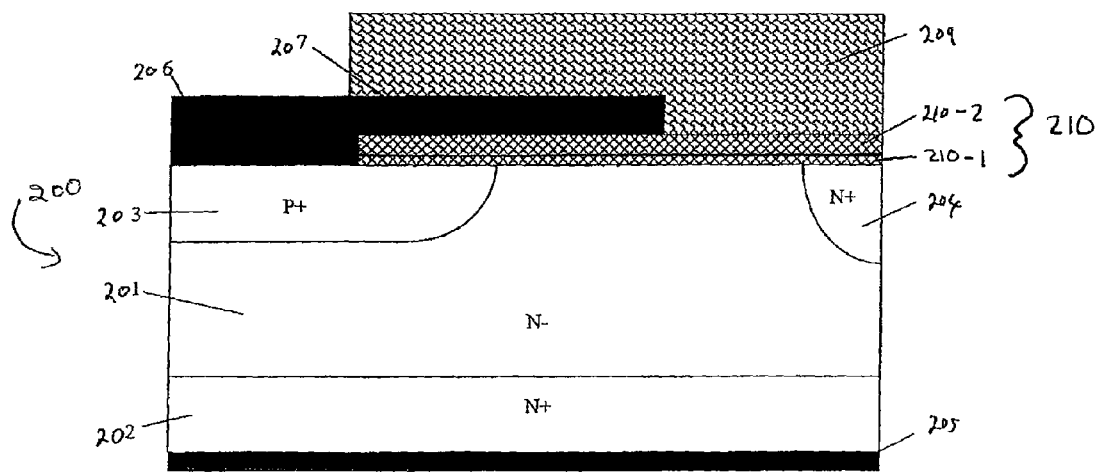
FIG. 2 illustrates a diode according to one embodiment of the present invention.

FIG. 2 illustrates a diode 200 according to one embodiment of the present invention. The silicon dioxide for the diode 200 is formed using Plasma Enhanced Chemical Vapor Deposition (PECVD) oxide. The PECVD process utilizes a plasma to enhance chemical reaction rates of the precursors. Accordingly, PECVD processing allows deposition at lower temperatures. The PECVD process is generally considered to be a not clean ("dirty") process and is not used to form a layer that directly contacts the N− silicon layer. The present inventor, however, discovered that the use of PECVD oxide as a passivation layer formed directly on the N− silicon enables the diode to exhibit consistent leakage current characteristics even under HTRB and Humidity test conditions.

A first PECVD oxide layer is formed on an N− type region 201 using a PECVD machine. The first PECVD oxide layer 210-1 is formed at 400 degrees Celsius or less. A first photomask layer is formed and patterned to open an N+ region 204. N-type dopants are driven into the opening to form the N+ region. A second photomask layer is provided and patterned to open a P+ region 203. P-type dopants are provided on the area exposed by the opening. Boron is typically used as the P-type dopants, but other P-types dopants may be used. The silicon is heated in oxygen ambient to drive the P-type dopants into the substrate to form an emitter region 203.

A second PECVD oxide layer 210-2 is formed on the first PECVD oxide layer 210-1 using a PECVD machine. The first and second oxide layers 210-1, 210-2 together define an oxide layer 210. The duration of the PECVD process may be adjusted to obtain a desired thickness for the oxide layer 210.

A third photomask layer is formed and pattern to define the contact opening for an anode 206. A metal layer is formed on the contact opening and then patterned to expose the oxide layer 210. A polymide layer is formed on the oxide layer as a second passivation layer 209. The polymide layer is generally formed to a thickness of 10-20 microns.

The above process steps associated with the diode 200 are summarized below.
1. PECVD oxide
2. Photomask: open N+ area
3. N+ doping and drive-in
4. Photomask: open p+ area (emitter)
5. P+ doping (Boron implantation)
6. P+ drive-in
7. PECVD oxide (to obtain correct PECVD oxide thickness)
8. Photomask for contact opening
9. Metallization
10. Photomask: Open metallization on Passivation layer
11. 10 to 20 microns polymide passivation.

The diode 200 fabricated by using the above process exhibits low leakage current during a static condition. For example, for a diode rated at 300V, the leakage current is 1 µA at 25 degrees centigrade, and 30 µA at 150 degrees centigrade. However, the diode continues to exhibit low leakage current even during the HTRB test. HTRB test results show consistent results and no appreciable increase in leakage current. In addition, the diode 200 also exhibited good consistent breakdown results during Humidity test conducted at 85 degrees Celsius and 85 percent humidity.

The present inventors believe that the phenomenon of the increased leakage current is affected in part by the quality of silicon dioxide formed on the substrate, the interface state of silicon and silicon dioxide and mobile ions. The PEVCD oxide grown in a plasma environment provides more positive charge. Therefore these charges provide a counter balance during HTRB and Humidity tests, providing the device with more consistent characteristics.

In one embodiment, the diode 200 may be a fast recovery diode, in which case platinum is provided in the substrate. The platinum dopants are provided within the substrate typically between the step 8 (photomask for contact opening) and step 9 (metallization) above. Alternatively, the substrate may be doped with gold (Au).

Figure 3:
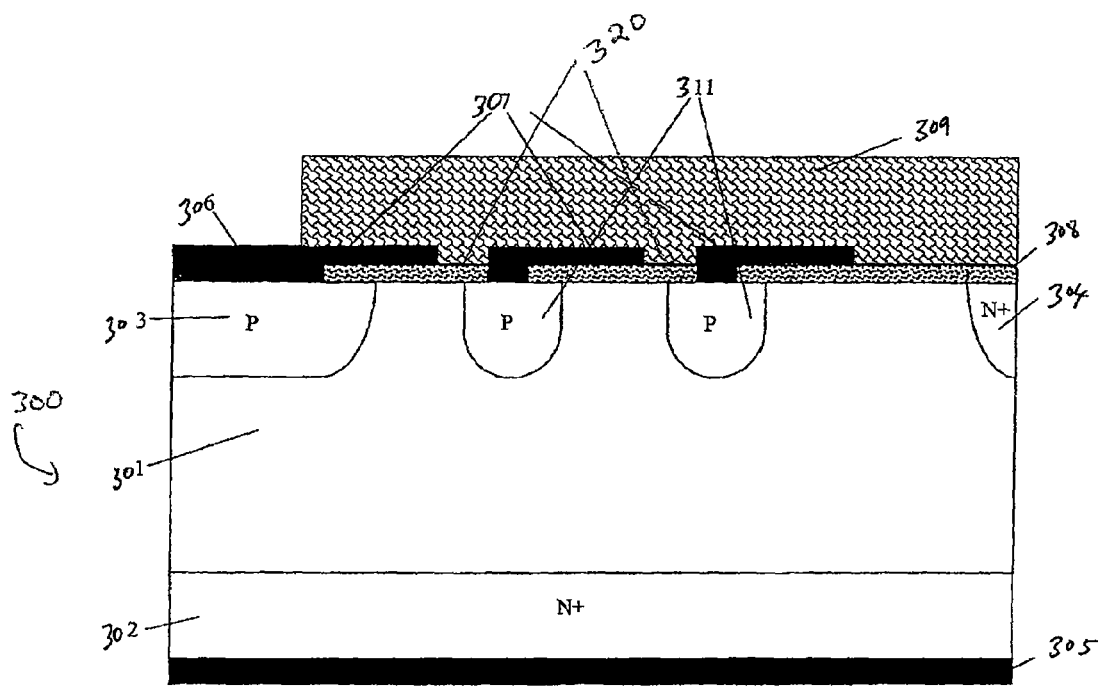
FIG. 3 illustrates a diode designed for high blocking voltage (i.e., above 400V).

FIG. 3 illustrates a diode 300 designed for high blocking voltage (i.e., above 400V). The diode 300 includes an N− region 301 and N+ substrate 302. An emitter region 303 is formed on an upper portion of the N− region 301. An anode 306 contacts the emitter region 303. A plurality of guard rings 311 surrounding the emitter region. Alternatively or in combination, one or more field plates 307 may be provided. An N+ region 304 (or channel stopper) is provided at an edge of the N− region 301. A first passivation layer 308 covers the surface between the emitter region 303 and the N+ region 304. The first passivation layer is made of thermally grown oxide as with the diode 100. A second passivation layer 309 is formed on the first passivation layer. An N+ layer 302 is formed on the backside of the N− region 301. A cathode 305 contacts the N+ layer. During Humidity and HTRB test conditions, ions may migrate to the silicon and oxide interface layer through a gap 320 between the field plate edge and the guard ring. This leads to an increased leakage current, and the device may burn out in real applications.

Figure 4:
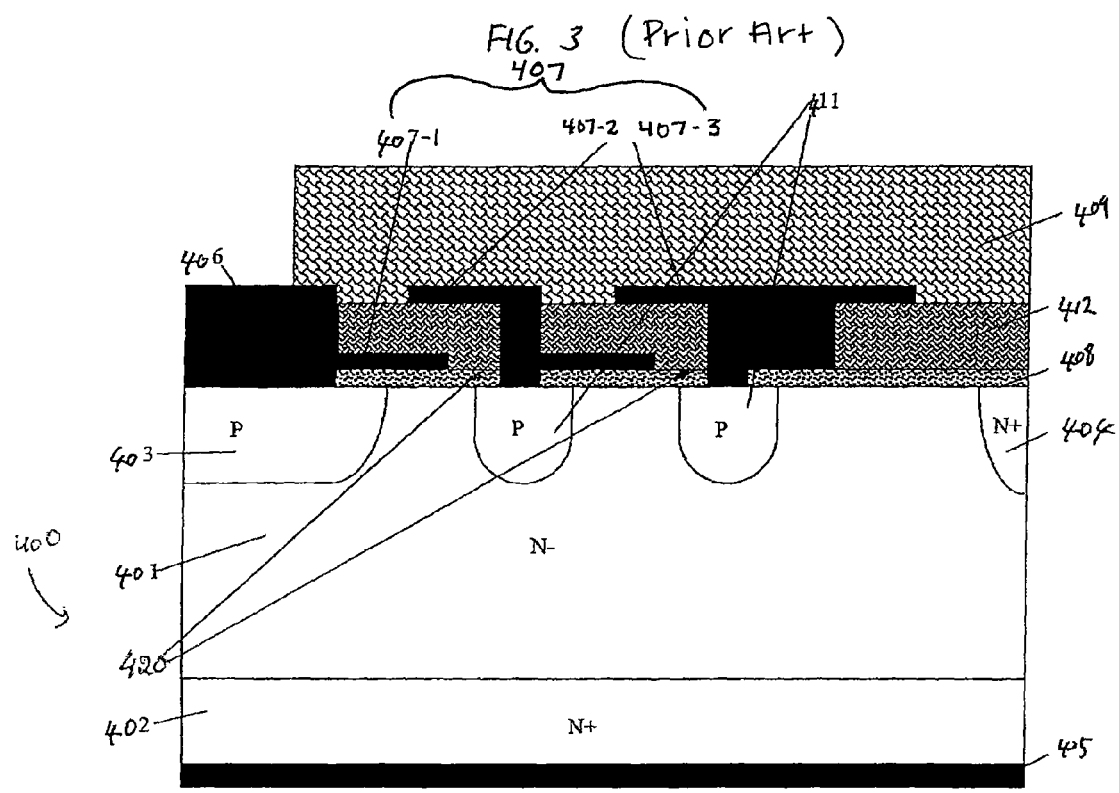
FIG. 4 illustrates a diode designed for high blocking voltage (i.e., above 400V) according to one embodiment of the present invention.

FIG. 4 illustrates a diode 400 designed for high blocking voltage (i.e., above 400V) according to one embodiment of the present invention. The diode 400 includes an N− region 401. An emitter region 403 is formed on an upper portion of the N− region 401. An anode 406 contacts the emitter region 403. A plurality of guard rings 411 surrounding the emitter region. Alternatively or in combination, one or more field plates 407 may be provided. A gap 420 is defined between the field plate and the guard ring.

An N+ region 404 (or channel stopper) is provided at an edge of the N− region 401. A first passivation layer 408 covers the surface between the emitter region 403 and the N+ region 404. The first passivation layer may be made of thermally grown oxide as with the diode 100 or PECVD oxide as with the diode 200. A second passivation layer 412 is formed on the first passivation layer. The second passivation layer 412 has a thickness of 3-10 microns in the present implementation. The second passivation layer may be made of polymide or PECVD oxide or other suitable insulation layer. A third passivation layer 409 is formed on the second passivation layer. An N+ layer 402 is a substrate or deep diffused phosphorous wafers. A cathode 405 contacts the N+ layer.

In the present implementation, there are a plurality of field plates types. A first field plate type 407-1 has a portion that extends along a first lateral direction. A second field plate type 407-2 has a portion that extends along a second lateral direction that is an opposite direction of the first lateral direction, so that the two portions overlap each other. Accordingly, these two plates define a curved path to the gap 420 from the third passivation layer 409. This curved path (or longer path) makes it more difficult for the foreign particles from penetrating into interface of the substrate 401 and silicon dioxide 408.

The second field plate 407-2 includes another portion that extends along the first lateral direction. A third field plate 407-3 includes a portion that extends along the second lateral direction, so that these two portions overlap with each other and define a curved path. This curved path also hinders the foreign particles from penetrating into the interface of the substrate and silicon dioxide, as explained above.

The present invention has been described in terms of specific embodiments for illustrative purposes. The embodiments disclosed above may be changed or modified without departing from the scope of the present invention. For example, the PECVD oxide may be used for MOSFET or IGBT as well as the diode. Accordingly, the scope of the invention should be interpreted using the appended claims.

What is claimed is:

1. A method of manufacturing a power semiconductor device comprising:
    on a substrate of more strongly doped first conductivity type silicon, forming a less strongly first conductivity type epitaxial silicon layer;
    using a plasma enhanced chemical vapor deposition process forming a first silicon dioxide layer directly on the epitaxial silicon layer;
    introducing into a first region of the epitaxial layer more strongly doped first conductivity type impurity to define a channel stopper region, and introducing into a second region spaced apart from the first region an opposite conductivity type impurity to define an emitter region;
    using a plasma enhanced chemical vapor deposition process forming a second silicon dioxide layer directly on at least the first silicon dioxide layer to thereby form a first passivation layer which includes both the first silicon dioxide layer and the second silicon dioxide layer;
    forming a first field plate on the passivation layer, the first field plate extending to electrically contact at least a portion of the emitter region and overlying at least a portion of the epitaxial layer adjacent to the emitter region;
    forming a second passivation layer on at least a portion of the first passivation layer and on at least a portion of the first field plate; and further comprising a step of introducing platinum or gold into the epitaxial layer.

2. The method of claim 1 further including introducing, into a third region spaced apart from the first region and the emitter, opposite conductivity type impurity to define a guard ring surrounding the emitter region.

3. The method of claim 1, wherein the first passivation layer has a thickness 3 microns or less, wherein the second passivation layer comprises polyimide and has a thickness of at least 16 microns.

4. The method of claim 1, wherein the first passivation layer has a thickness 3 microns or less.

5. The method of claim 1, wherein the first passivation layer has a thickness about 0.5 micron to about 3 microns.

6. The method of claim 1, wherein the power semiconductor device comprises a fast recovery diode.

7. The method of claim 1, wherein the power semiconductor device comprises a metal-oxide-semiconductor field-effect transistor (MOSFET) or an insulated-gate bipolar transistor (IGBT).

8. The method of claim 1 further comprising forming a third passivation layer on the second passivation layer.

9. The method of claim 8, wherein the first portion of the first field plate extends along the first lateral direction between the first and second passivation layers, and further including a second portion of a second field plate which extends along the second lateral direction between the second and third passivation layers, wherein the first field plate and the second field plate overlap to prevent foreign particles from penetrating into the interface between the first silicon dioxide layer and the epitaxial layer.

10. The method of claim 9 wherein the power semiconductor device comprises a diode having a blocking voltage of at least about 400 volts.

11. The method of claim 9 wherein the discrete power device comprises a diode, a MOSFET, or an IGBT.

12. The method of claim 9 wherein the second field plate overlaps the first field plate by 2 to 15 microns.

13. The method of claim 1 wherein the first conductivity type is n conductivity type.

14. The method of claim 1 wherein the second passivation layer comprises a polyimide layer.

15. The method of claim 14 wherein the second passivation layer has a thickness of about 3 microns to about 20 microns.

* * * * *